US008354657B2

(12) United States Patent
Soumagne et al.

(10) Patent No.: US 8,354,657 B2
(45) Date of Patent: *Jan. 15, 2013

(54) EXTREME ULTRA VIOLET LIGHT SOURCE APPARATUS

(75) Inventors: Georg Soumagne, Hiratsuka (JP); Yoshifumi Ueno, Hiratsuka (JP); Hiroshi Komori, Hiratsuka (JP); Akira Sumitani, Hiratsuka (JP); Katsunobu Nishihara, Suita (JP); Young Gwang Kang, Suita (JP); Masanori Nunami, Suita (JP)

(73) Assignees: Gigaphoton Inc., Tokyo (JP); Osaka University, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/047,131

(22) Filed: Mar. 14, 2011

(65) Prior Publication Data

US 2011/0163247 A1  Jul. 7, 2011

Related U.S. Application Data

(63) Continuation of application No. 12/385,569, filed on Apr. 13, 2009, now Pat. No. 7,928,418.

(30) Foreign Application Priority Data

Apr. 14, 2008  (JP) ................................. 2008-104280

(51) Int. Cl.
*A61N 5/06* (2006.01)
*G01J 3/10* (2006.01)

(52) U.S. Cl. ................ 250/504 R; 250/423 R; 250/424; 315/111.21; 315/111.81; 422/24; 156/345.48; 156/345.5

(58) Field of Classification Search .............. 250/504 R, 250/423 R, 424; 315/111.21, 111.81; 422/24; 156/345.48, 345.5

See application file for complete search history.

(56) References Cited

U.S. PATENT DOCUMENTS

| 6,987,279 | B2 | 1/2006 | Hoshino et al. |
| 7,928,418 | B2 * | 4/2011 | Soumagne et al. ....... 250/504 R |
| 2009/0261242 | A1 | 10/2009 | Ueno et al. |
| 2010/0243922 | A1 | 9/2010 | Asayama et al. |

FOREIGN PATENT DOCUMENTS

JP  2000-223757 A  8/2000

(Continued)

OTHER PUBLICATIONS

Japanese Office Action, and partial English translation thereof, issued in Japanese Patent Application No. 2008-104280 dated Oct. 2, 2012.

*Primary Examiner* — David A Vanore
(74) *Attorney, Agent, or Firm* — McDermott Will & Emery LLP

(57) ABSTRACT

In an extreme ultra violet light source apparatus of a laser produced plasma type, charged particles such as ions emitted from plasma are promptly ejected to the outside of a chamber. The apparatus includes a chamber, a target supply unit for supplying a target material into the chamber, a collector mirror for collecting extreme ultra violet light radiated from plasma generated by irradiating the target material with a laser beam to output the extreme ultra violet light, an electromagnet arranged outside of the chamber, and a charged particle collection mechanism provided on at least one of two surfaces of the chamber to which lines of magnetic force generated by the electromagnet extend.

8 Claims, 6 Drawing Sheets

FOREIGN PATENT DOCUMENTS

| | | |
|---|---|---|
| JP | 2005-197456 | 7/2005 |
| JP | 2005-522839 A | 7/2005 |
| JP | 2007-522646 A | 8/2007 |
| JP | 2007-273239 A | 10/2007 |
| JP | 2008-053696 A | 3/2008 |
| WO | WO-03/087867 A3 | 12/2003 |
| WO | WO-2005/064401 A3 | 9/2005 |

* cited by examiner

EXTREME ULTRA VIOLET LIGHT SOURCE APPARATUS

This is a continuation of application Ser. No. 12/385,569, filed Apr. 13, 2009 now U.S. Pat. No. 7,928,418.

BACKGROUND OF THE INVENTION

1. Field of the Invention

The present invention relates to an extreme ultra violet (EUV) light source apparatus to be used as a light source of exposure equipment.

2. Description of a Related Art

Recent years, as semiconductor processes become finer, photolithography has been making rapid progress to finer fabrication. In the next generation, microfabrication of 100 nm to 70 nm, further, microfabrication of 50 nm or less will be required. Accordingly, in order to fulfill the requirement for microfabrication of 50 nm or less, for example, exposure equipment is expected to be developed by combining an EUV light source generating EUV light having a wavelength of about 13 nm and reduced projection reflective optics.

As the EUV light source, there are three kinds of light sources, which include an LPP (laser produced plasma) light source using plasma generated by applying a laser beam to a target (hereinafter, also referred to as "LPP type EUV light source apparatus"), a DPP (discharge produced plasma) light source using plasma generated by discharge, and an SR (synchrotron radiation) light source using orbital radiation.

Among them, the LPP light source has advantages that extremely high intensity close to black body radiation can be obtained because plasma density can be considerably made larger, that the light emission of only the necessary waveband can be performed by selecting the target material, and that an extremely large collection solid angle of $2\pi$ steradian can be ensured because it is a point light source having substantially isotropic angle distribution and there is no structure surrounding the light source such as electrodes. Therefore, the LPP light source is considered to be predominant as a light source for EUV lithography requiring power of more than several tens of watts.

FIG. 10 is a diagram for explanation of a principle of generating EUV light in an LPP type EUV light source apparatus. The EUV light source apparatus shown in FIG. 10 includes a driver laser 901, a collective lens 902, a target supply unit 903, a target supply nozzle 904, and an EUV collector mirror 905. The driver laser 901 is a laser light source for generating a laser beam for exciting a target material by pulse oscillation. The collective lens 902 collects the laser beam outputted from the driver laser 901 in a predetermined position. The target supply unit 903 supplies the target material to the target supply nozzle 904 and the target supply nozzle 904 supplies the target material to the predetermined position.

When the laser beam is applied to the target material supplied from the target nozzle 904, the target material is excited and plasma is generated, and light having various wavelength components is radiated from the plasma. The EUV collector mirror 905 has a concave reflection surface that reflects and collects the light radiated from the plasma. On the reflection surface, a film in which molybdenum and silicon are alternately stacked (Mo/Si multilayer film), for example, is formed for selective reflection of a predetermined wavelength component (e.g., near 13.5 nm). Thereby, the EUV light having the predetermined wavelength component radiated from the plasma is outputted to an exposure unit or the like.

In the LPP type EUV light source apparatus, there is a problem of the influence by charged particles such as fast ions emitted from plasma. This is because the EUV collector mirror 905 is located near the emission point, and thus, the fast ions and so on collide with the EUV collector mirror 905 and the reflection surface (Mo/Si multilayer film) of the mirror is sputtered and damaged. In order to improve the EUV light use efficiency, it is necessary to keep the reflectance of the EUV collector mirror 905 high. For the purpose, high flatness is required for the reflection surface of the EUV collector mirror 905, and the mirror becomes very expensive. Accordingly, longer life of the EUV collector mirror 905 is desired in view of reduction in operation cost of the exposure equipment using the EUV light source apparatus, reduction in maintenance time, and so on.

As a related technology, Japanese Patent Application Publication JP-P2005-197456A discloses a light source apparatus in which the life of the collector mirror can be extended and the running cost can be reduced by protecting the collector mirror from debris that may cause damage to the mirror coating while securing the catching solid angle and the catching efficiency of the EUV light. The light source apparatus includes a target supply unit for supplying a material to become a target, a laser unit for applying a laser beam to the target to generate plasma, a collective optics for collecting and outputting extreme ultra violet light emitted from the plasma, and magnetic field generating means for generating a magnetic field within the collective optics to trap charged particles emitted from the plasma when current is supplied. As the magnetic field generating means, a pair of mirror coils with the collective optics in between or a baseball coil accommodating the collective optics is used.

Further, U.S. Pat. No. 6,987,279 B2 discloses a light source device including a target supply unit for supplying a material to become the target, a laser unit for generating plasma by applying a laser beam to the target, a collection optical system for collecting the extreme ultraviolet light radiating from the plasma and emitting the extreme ultraviolet light, and magnetic field generating unit for generating a magnetic field within the collection optical system when supplied with current so as to trap charged particles radiating from the plasma. In the light source device, ions radiating from the plasma are trapped near the plasma by forming a mirror magnetic field by using Helmholtz electromagnets. Thereby, the damage on the EUV collector mirror by so-called debris of ions and so on is prevented.

In the EUV light source apparatus using two coils as disclosed in JP-P2005-197456A, the two coils are arranged to be in parallel or substantially in parallel with each other and opposed such that the centers of the apertures of the two coils are aligned. The EUV collector mirror is provided in a gap space between the two coils, and accordingly, sufficient magnetic field intensity is necessary in the gap space between the two coils. The necessary magnetic field intensity differs depending on the distance from the coil to the EUV collector mirror, the mass number, charge states, kinetic energy of ions to be generated, and so on, and it is considered that the higher the magnetic field intensity, the more desirable. Since the gap length between the two coils and the center magnetic field intensity have an inverse relationship, the shorter the gap, the easier the generation of a strong magnetic field, while the longer the gap, the harder the generation of the strong magnetic field.

The currently envisioned diameter of the EUV collector mirror used in the EUV light source apparatus is about 300 mm, and a gap length of 300 mm or more is necessary. Further, in view of various mechanisms necessary for the EUV light source apparatus such as a holding and adjustment mechanism of the EUV collector mirror and a holding and adjustment mechanism of the laser beam focusing optics, it is necessary to make the gap length longer. For example, according to the technical estimation of an existing superconducting magnet, in the case of a conventional mirror magnetic field, the center magnetic field is 3 T at the maximum in a gap of 450 mm, while the maximum magnetic field becomes lower to 2.3 T in a gap of 600 mm. Therefore, in the case of using two coils, for generation of a stronger magnetic field, it is necessary to arrange the two coils at the possible minimum distance with the EUV collector mirror in between.

Consequently, it is considered that the two coils are provided within a vacuum chamber in which plasma is generated. In this case, in order to keep the degree of vacuum within the chamber and prevent emission of contaminants, various ideas are necessary for the respective coils to isolate the coils from the vacuum space within the chamber. Further, in the case of using two coils, very strong force acts on the coils attracting (or repelling) each other due to the magnetic field, and a strong structure (support) for counteracting the force is necessary. Therefore, in the case of using two coils, a large structure (support) is necessary between the two coils and the available space is limited.

In the case of using a pair of mirror coils as shown in FIG. 3 of JP-P2005-197456A, a magnetic field distribution called a mirror magnetic field is obtained, in which the magnetic flux density increases vertically symmetrically in the Z-axis direction from the plasma position. In the case of such a symmetric magnetic field, the main purpose is to prevent damage on the collector mirror by confining charged particles in the valley of potential by the mirror magnetic field generated by the coils 6 and 7 and trapping them around the emission point. It is considered that, when the charged particles are trapped around the emitting point in this manner, the concentration of the target gas (ions and neutralized atoms of the target material) remaining within the vacuum chamber rises. The target gas absorbs the EUV light radiated from the plasma, and accordingly, there occurs a problem that the available EUV light is reduced because of the concentration rise. Further, when a metal or the like is used as the target, there is concern that the remaining target gas attaches to the structures within the chamber and the EUV collector mirror and so on. Especially, in the case of plasma generation by highly-repeated operation required for the EMT light source apparatus, it is considered that such a tendency is remarkable.

Further, in the case of using a baseball coil as shown in FIG. 7 of JP-P2005-197456A, the magnetic flux density increases in all directions from the center of the magnetic field, and accordingly, a magnetic field distribution for the purpose of complete trapping (confining) is generated, and the same problems occur. For the above-mentioned reasons, it is desirable that the charged particles generated in the plasma are efficiently and promptly ejected without spending time rather than trapped or ejected in a long time.

In terms of behavior stability of charged particles, in the case of the mirror magnetic field, the magnetic field intensity in a direction orthogonal to the Z-axis becomes weaker toward the outside, and therefore, fast charged particles having high energy behaves very unreliably so as to twine around the lines of magnetic force while flying out, and the ejection of charged particles is not very good. On the other hand, in the case of the baseball magnetic field, the symmetric magnetic field distribution in which the magnetic field intensity increases from the center toward all directions, and therefore, the behavior stability of charged particles is high in trapping.

However, the original purpose of the baseball magnetic field is trapping, and the ejection of charged particles is very poor.

Further, in U.S. Pat. No. 6,987,279 B2, in order to efficiently eject ions and so on from the vicinity of the plasma and the collector mirror to reduce the concentration of the target gas (ions and neutralized atoms of the target material) remaining near the plasma, the magnetic field is formed such that the magnetic flux density becomes lower on the opposite side of the collector mirror. By the influence of the magnetic field, the ions and so on are guided toward the lower magnetic flux density, i.e., toward the opposite direction to the collector mirror.

However, even when the ions and so on can be guided outside of the magnetic field in this manner, the concentration of the target gas remaining within the chamber rises again unless the ions and so on are efficiently ejected to the outside of the chamber. The target gas absorbs the EUV light radiated from the plasma, and accordingly, there occurs a problem that the available EUV light is reduced because of the concentration rise. Therefore, it is necessary to provide a mechanism for efficiently ejecting the target gas to the outside of the chamber (e.g., an eject opening having a large diameter) in an appropriate position in addition to the configurations shown in FIGS. 6A and 7 of U.S. Pat. No. 6,987,279 B2.

Providing an ejection mechanism of ions and so on in the devices shown in FIGS. 6A and 7 of U.S. Pat. No. 6,987,279 B2 causes the following problems. That is, in a general EUV light source apparatus, a filter for purifying the spectrum of the EUV light, a coupling mechanism to an exposure unit, and so on are provided at the side opposite to the EUV collector mirror (the traveling direction of the reflected EUV light). Accordingly, in consideration of the interference with the filter, coupling mechanism, and so on, it is difficult to provide the ejection mechanism of ions and so on at the side opposite to the EUV collector mirror. However, when the ejection mechanism, particularly, the position of the ejection opening formed in the chamber is inappropriate, the ejection speed of ions and so on becomes lower and the concentration of ions and so on rises within the chamber. Especially, in the case of EUV light generation by highly-repeated operation, it is considered that such a tendency is remarkable.

SUMMARY OF THE INVENTION

The present invention has been achieved in view of the above-mentioned problems. A purpose of the present invention is, in an extreme ultra violet light source apparatus of a laser produced plasma type, to promptly eject charged particles such as ions emitted from plasma to the outside of a chamber.

In order to accomplish the above-mentioned purpose, an extreme ultra violet light source apparatus according to one aspect of the present invention is an extreme ultra violet light source apparatus of a laser produced plasma type for generating extreme ultra violet light by applying a laser beam to a target material, including: a chamber in which extreme ultra violet light is generated; target supply means for supplying a target material to a predetermined position within the chamber; a driver laser for applying a laser beam to the target material supplied by the target supply means to generate plasma; a collector mirror for collecting the extreme ultra violet light radiated from the plasma to output the extreme ultra violet light; magnetic field forming means for forming an asymmetric magnetic field in a generation position of the plasma by using a coil; and a charged particle collection mechanism provided on at least one of two surfaces of the chamber to which lines of magnetic force generated by the coil extend.

According to the present invention, the charged particles such as ions emitted from the plasma can be led in a desired direction by the influence of the asymmetric magnetic field formed by using a coil, and collected by the charged particle collection mechanism. Therefore, the charged particles such as ions can be promptly ejected to the outside of the chamber, and thereby, contamination and damage of the EUV collector mirror and rise of the concentration of ions and so on can be suppressed.

DESCRIPTION OF THE PREFERRED EMBODIMENTS

Figure 1:
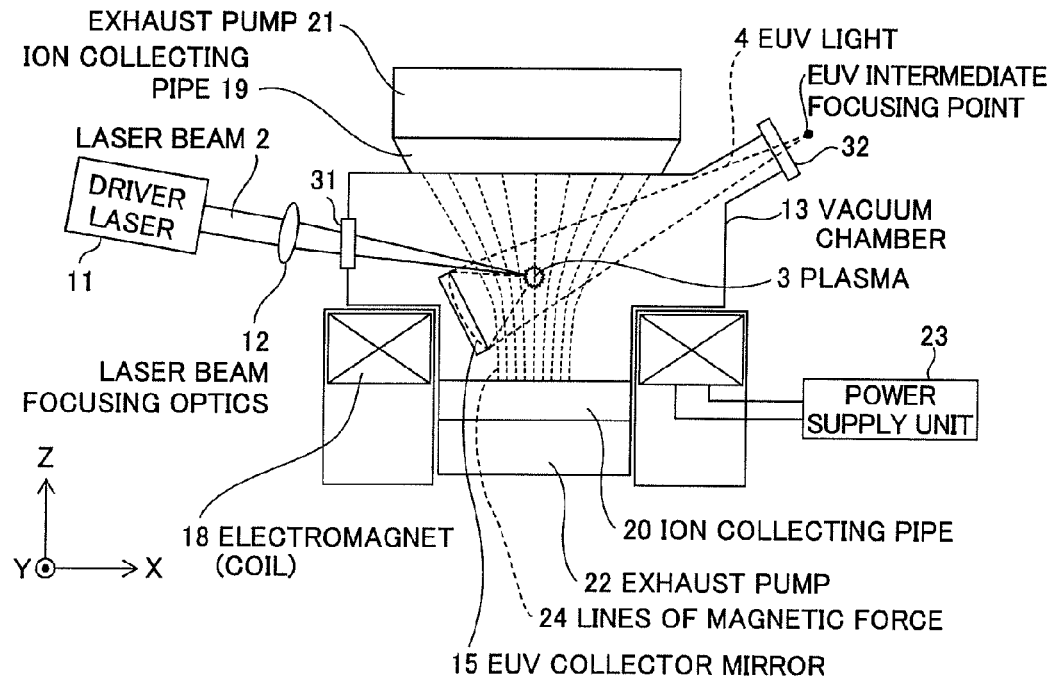
FIG. 1 is a side view showing a configuration of an EUV light source apparatus according to the first embodiment of the present invention.

Hereinafter, preferred embodiments of the present invention will be explained in detail by referring to the drawings. The same reference numerals are assigned to the same component elements and the description thereof will be omitted.

Figure 2:
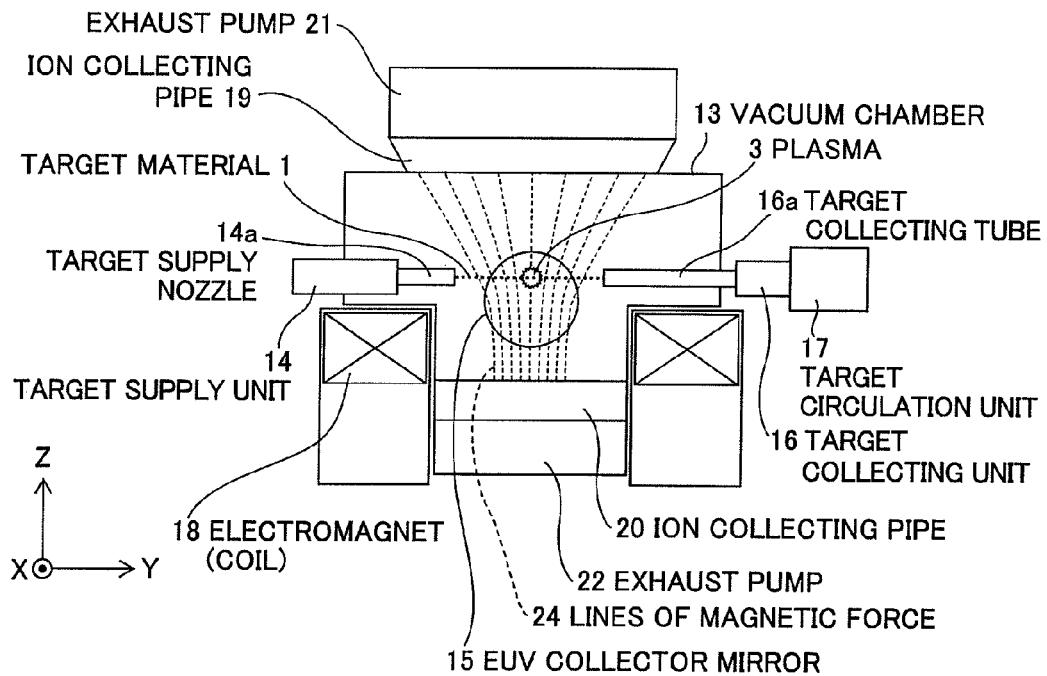
FIG. 2 is a rear view showing the configuration of the EUV light source apparatus according to the first embodiment of the present invention.

FIG. 1 is a side view showing a configuration of an EUV light source apparatus according to the first embodiment of the present invention, and FIG. 2 is a rear view showing the configuration of the EUV light source apparatus according to the first embodiment of the present invention. The EUV light source apparatus according to the embodiment is a laser produced plasma (LPP) type for generating EUV light by applying a laser beam to a target material for excitation.

As shown in FIGS. 1 and 2, the EUV light source apparatus includes a driver laser 11 for generating an excitation laser beam 2, a laser beam focusing optics 12 for focusing the laser beam 2 generated by the driver laser 11, a vacuum chamber 13 in which EUV light is generated, a target supply unit 14 for supplying a target material 1, an EUV collector mirror 15 for collecting EUV light 4 generated from plasma 3 generated when the excitation laser beam 2 is applied to the target material 1, and a target collecting unit 16 for collecting the target material 1 that has not contributed to the generation of the plasma 3.

Further, the EUV light source apparatus includes a target circulation unit 17 for circulating the target material 1 according to need, an electromagnet (coil) 18 for leading charged particles such as ions emitted from plasma in a desired direction, ion collecting pipes 19 and 20 provided on the upper surface and the lower surface of the vacuum chamber 13, for collecting the charged particles led by the electromagnet 18, and exhaust pumps 21 and 22 connected to the ion collecting pipes 19 and 20. The exhaust pumps 21 and 22 may be provided as one exhaust pump. Further, the ion collecting pipe and the exhaust pump may be provided on one of the upper surface and the lower surface of the vacuum chamber 13 (e.g., only on the upper surface).

The driver laser 11 is a laser beam source capable of pulse oscillation at a high repetition frequency (e.g., the pulse width is about several nanoseconds to several tens of nanoseconds, and the frequency is about 1 kHz to 100 kHz) and generates the laser beam 2 for application and excitation of the target material 1. Further, the laser beam focusing optics 12 includes at least one lens and/or at least one mirror, and focuses the laser beam 2 generated by the driver laser 11 in a predetermined position. The laser beam focusing optics 12 may be provided outside of the vacuum chamber 13 as shown in FIG. 1, or inside of the vacuum chamber 13.

The vacuum chamber 13 is made of a non-magnetic material such as stainless steel so that the magnetic flux penetrates into the chamber. The vacuum chamber 13 is provided with a lead-in window 31 that leads in the excitation laser beam 2 and a lead-out window 32 that leads out the EUV light radiated from the plasma to an EUV intermediate focusing point.

The target supply unit 14 shown in FIG. 2 supplies the target material 1 to be excited and turned into a plasma state when the laser beam is applied thereto to the predetermined position within the vacuum chamber 13. As the target material 1, xenon (Xe), mixture with xenon as the main component, argon (Ar), krypton (Er), water ($H_2O$) or alcohol, which are in a gas state in a low-pressure condition, metal such as tin (Sn) or lithium (Li), water or alcohol in which fine metal particles of tin, tin oxide, cupper, or the like are dispersed, an ionic solution of lithium fluoride (LiF) or lithium chloride (LiCl) solved in water, or the like is used.

The state of the target material may be gas, liquid, or solid. When a liquid target is used, a target supply nozzle 14a is provided for producing a target jet or droplet target. For example, when a target material in a gas state at the normal temperature such as xenon is used as a liquid target, the target supply unit 14 pressurizes and cools the xenon gas for liquefaction and supplies it to the target supply nozzle 14a. On the other hand, when a material in a solid state at the normal temperature such as tin is used as a liquid target, the target supply unit 14 heats tin for liquefaction and supplies it to the target supply nozzle 14a. The target supply nozzle 14a forms a target jet or droplet target by injecting the target material 1 supplied from the target supply unit 14.

The target collecting unit 16 is located in the position opposite to the target supply unit 14 with the emission point in between. The target collecting unit 16 collects the target material that has not been irradiated with the laser beam nor turned into a plasma state though injected from the target supply nozzle 4a. Thereby, contamination of the EUV collector mirror 15 and so on due to the flying unwanted target material is prevented and the reduction in the degree of vacuum within the vacuum chamber 13 is prevented. In the case of using a liquid target, a target collecting tube 16a is provided for collecting the liquid target that has not been used for plasma generation. According to need, the target circulation unit 17 for circulating and reusing the target material may be provided.

The laser beam 2 focused by the laser beam focusing optics 12 is applied in the predetermined position within the vacuum chamber 13 to the target material 1 supplied by the target supply unit 14, and thereby, part of the target material 1 is excited and turned into a plasma state, and various wavelength components are radiated from the emission point. Here, the emission point refers to a position where the plasma 3 is generated when the laser beam 2 is applied to the target material 1.

The EUV collector mirror 15 is a collective optics for selectively reflecting and collecting a predetermined wavelength (e.g., EUV light near 13.5 nm) of the various wavelength components radiated from the plasma 3. The EUV collector mirror 15 has a concave reflection surface, and, for example, a molybdenum (Mo) and silicon (Si) multilayer film for selectively reflecting the EUV light having a wavelength near 13.5 nm is formed on the reflection surface. In FIG. 1, the EUV light 4 is reflected in an upper right direction and collected in the EUV intermediate focusing point by the EUV collector mirror 15 and outputted to an exposure unit. The collective optics of EUV light is not limited to the collector mirror as shown in FIG. 1, but may include plural optical components. In any case, it is necessary the collective optics is a reflective optics.

The electromagnet 18 includes a coil winding, a cooling mechanism for cooling the coil winding, and a container for holding them, and forms an asymmetric magnetic field in a plasma generation position (emission point) by using one coil. A power supply unit 23 for supplying current to the coil is connected to the electromagnet 18 via wiring. The electromagnet 18 may be provided inside or outside of the vacuum chamber 13. In the case where the electromagnet 18 is provided inside of the vacuum chamber 13, in order to keep the degree of vacuum within the vacuum chamber 13 and prevent emission of contaminants, it is necessary to accommodate the coil winding and the cooling mechanism in an airtight container of a non-magnetic metal such as stainless steel or ceramics or the like to isolate them from the vacuum space within the vacuum chamber 13. Accordingly, as shown in FIGS. 1 and 2, the electromagnet 18 is desirably provided outside of the vacuum chamber 13. Although the electromagnet 18 may be vertically or horizontally placed, the electromagnet 18 is horizontally placed under the vacuum chamber 13 in the first embodiment.

In FIGS. 1 and 2, the charged particle generated from the plasma 3 is subjected to Lorentz force by the magnetic field and makes drift movement upward (in the +Z direction) if it initially has an upward velocity component and downward (in the −Z direction) if it initially has a downward velocity component, while circling within the horizontal plane (XY-plane). In such an asymmetric magnetic field, since the charged particle having a velocity component in parallel with the lines of magnetic force moves toward the lower magnetic flux density, most of the charged particles spirally move upward (in the +Z direction) while twining around the lines of magnetic force. That is, in the embodiment, the asymmetric magnetic field is easily formed by one coil and the charged particles are promptly ejected mainly upward (in the +Z direction) along the lines of magnetic force because of the asymmetry of the magnetic field. Further, since the magnetic flux density increases from the emission point on the coil center toward the periphery (in the X-axis direction or Y-axis direction), there are advantages in behavior stability and ejection of charged particles.

Figure 3:
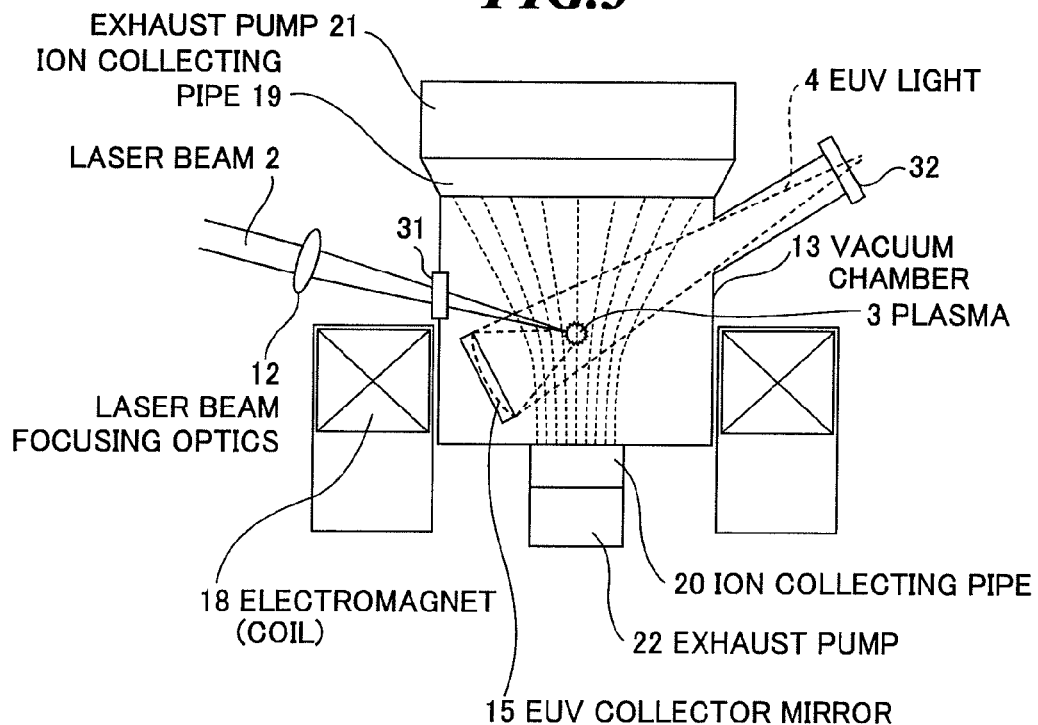
FIG. 3 is a side view showing a first modified example of the EUV light source apparatus according to the first embodiment of the present invention.
Figure 4:
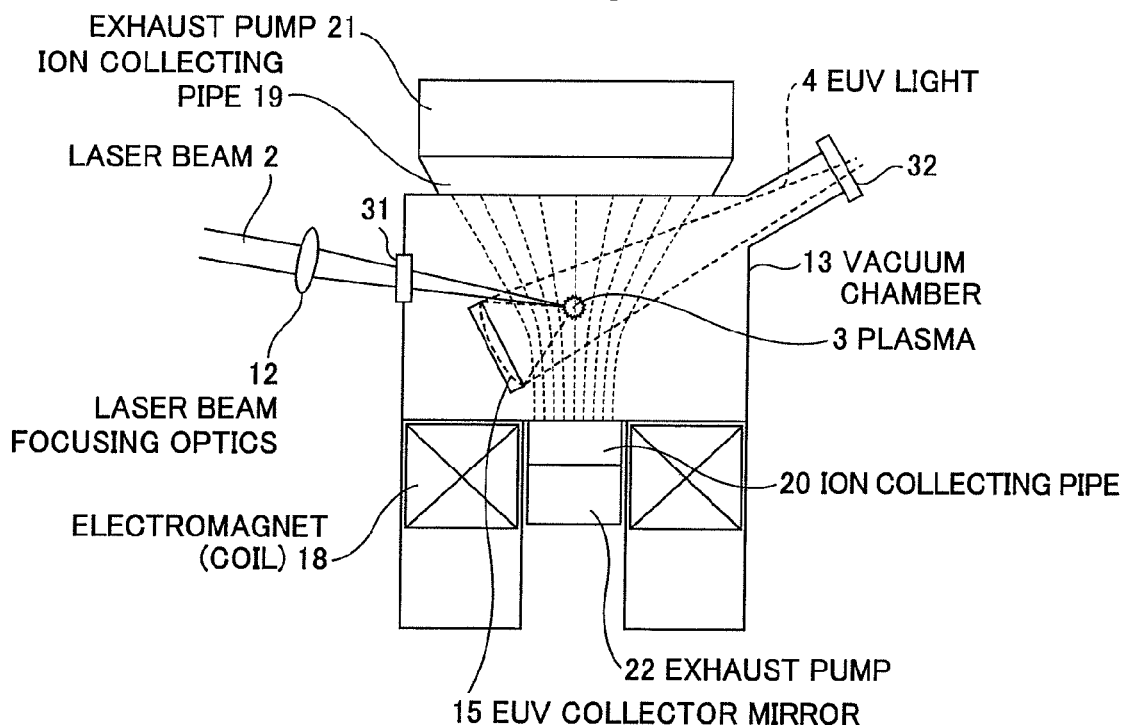
FIG. 4 is a side view showing a second modified example of the EUV light source apparatus according to the first embodiment of the present invention.

As described above, the charged particles move along the lines of magnetic force and are ejected, and thus, it is desirable that the EUV collector mirror 15 is provided along the lines of magnetic force substantially in parallel with the lines of magnetic force so as not to block the lines of magnetic force. This is because it is considered that the charged particles never collide with the EUV collector mirror 15 when the EUV collector mirror 15 is provided in a position not blocking the lines of magnetic force. As long as the EUV collector mirror 15 is in parallel with the EUV collector mirror 15, the half of it may be within the electromagnet (coil) 18 as shown in FIG. 1, all of it may be within the electromagnet (coil) 18 as shown in FIG. 3, or it may be located out of the electromagnet (coil) 18 as shown in FIG. 4.

Figure 5:
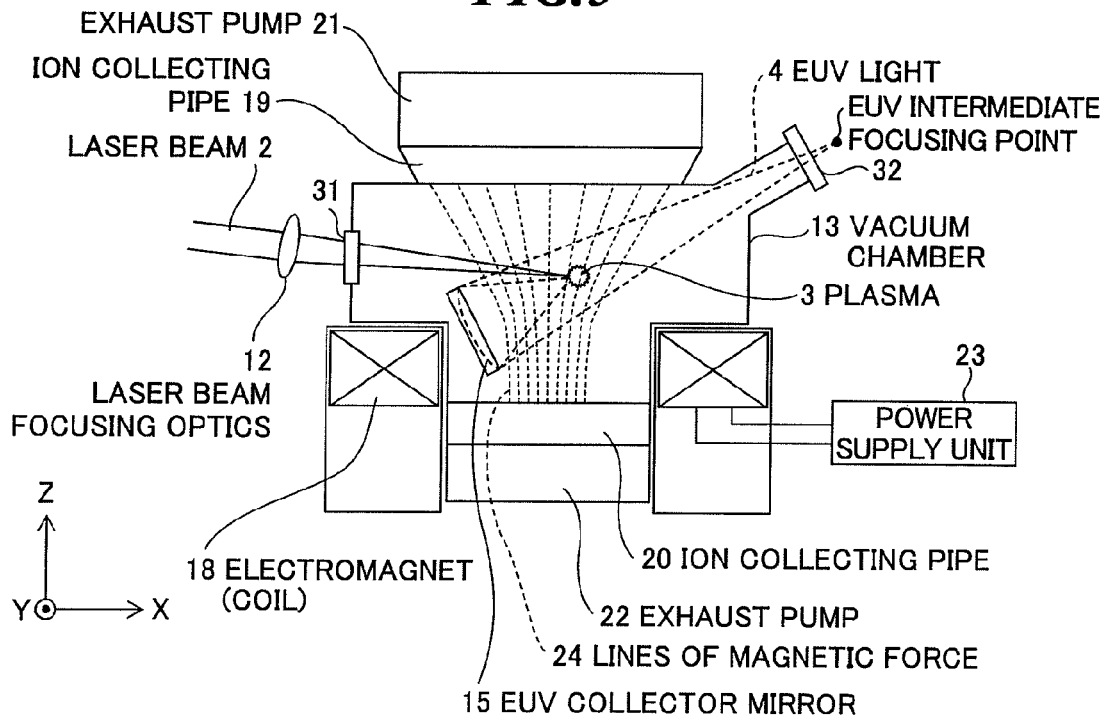
FIG. 5 is a side view showing a third modified example of the EUV light source apparatus according to the first embodiment of the present invention.

Further, the generation position of the plasma 3 may not be on the center axis of the lines of magnetic force. For example, as shown in FIG. 5, by shifting the generation position of plasma 3 apart from the EUV collector mirror 15 (in the positive direction of X-axis), the charged particles such as ions flying to the EUV collector mirror 15 can be further suppressed.

Figure 6:
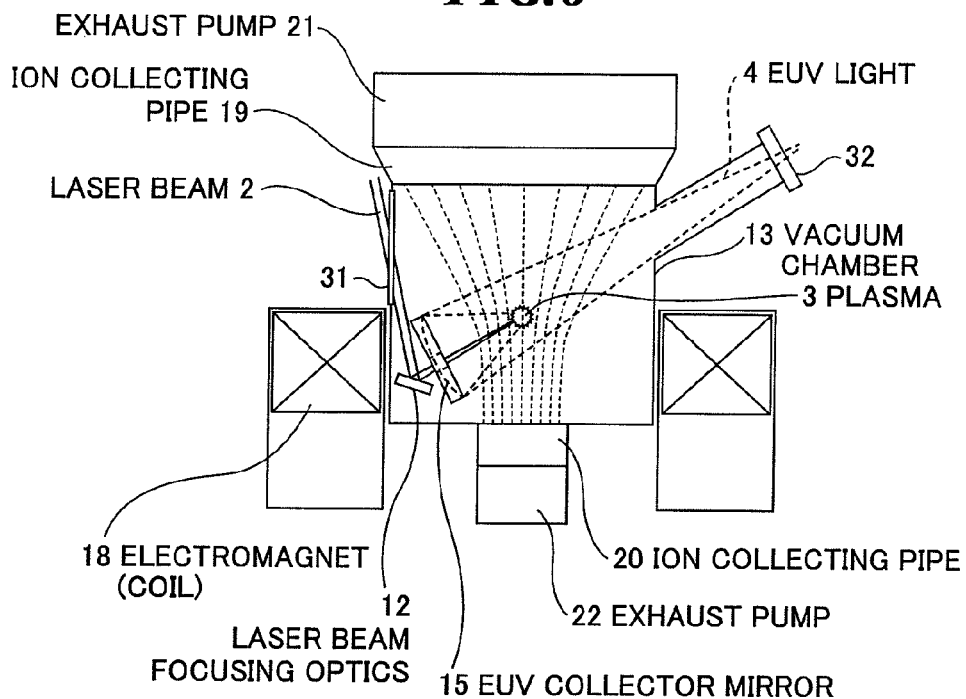
FIG. 6 is a side view showing a fourth modified example of the EUV light source apparatus according to the first embodiment of the present invention.

Furthermore, the direction in which the laser beam 2 enters the plasma 3 may be from the rear side of the EUV collector mirror 15 as shown in FIG. 6. In this case, a mirror is provided as a part of the laser beam focusing optics 12 within the vacuum chamber 13, and an aperture is formed in the center part of the EUV collector mirror 15.

Referring to FIGS. 1-6, in order to collect the charged particles moving upward (+Z direction) or downward (−Z direction) along the lines of magnetic force, the ion collecting pipes 19 and 20 are provided on the upper surface and the lower surface of the vacuum chamber 13, respectively, and the exhaust pumps 21 and 22 for guiding the charged particles staying within the vacuum chamber 13 to the ion collecting pipes 19 and 20 are provided above the ion collecting pipe 19 and under the ion collecting pipe 20, respectively. By providing the exhaust pumps 21 and 22 in the positions, the charged particles are ejected from the vacuum chamber 13 and collected by the ion collecting pipes 19 and 20 with efficiency.

Figure 7:
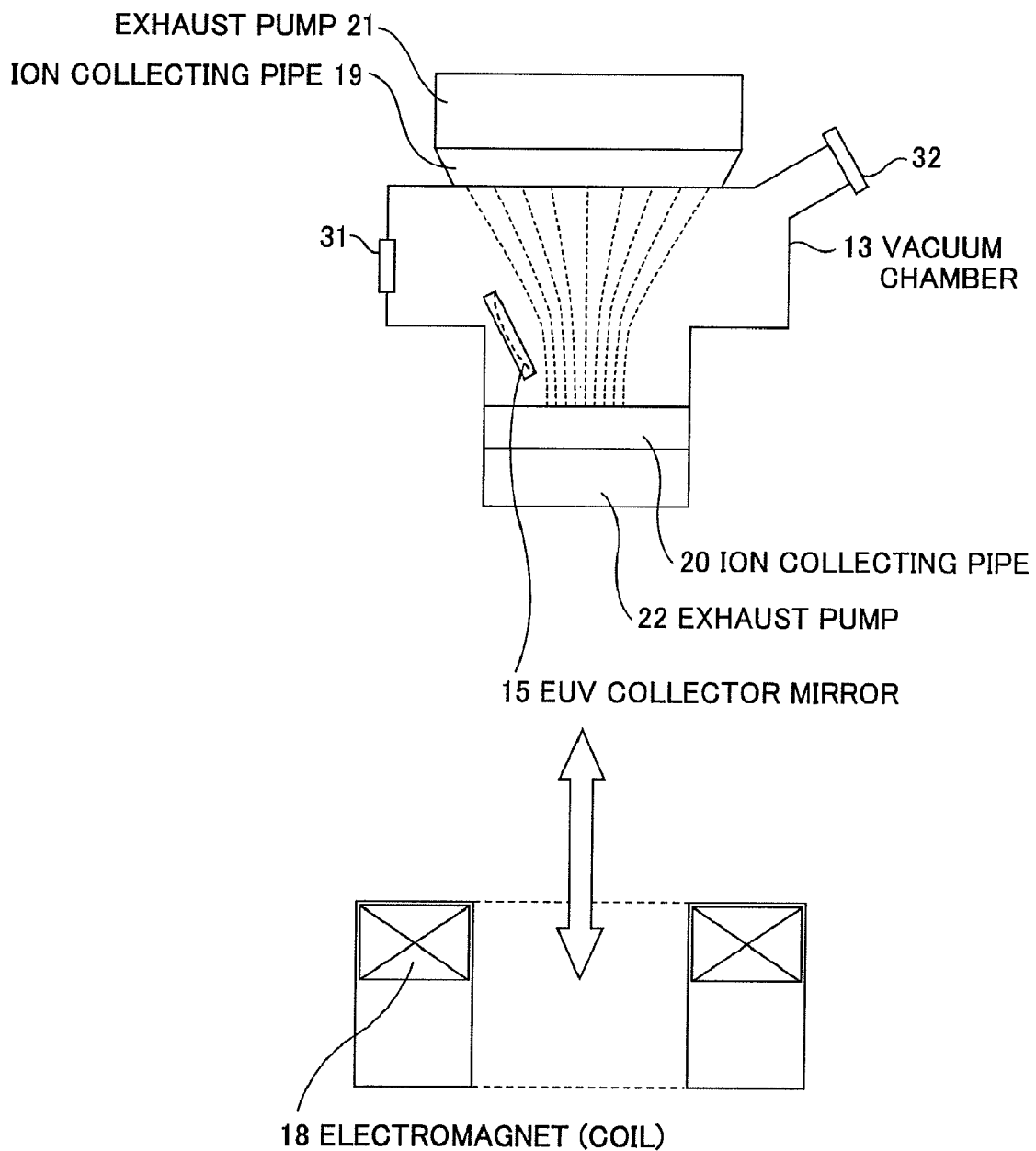
FIG. 7 shows a condition in which an electromagnet and a vacuum chamber are separated from each other in the first embodiment of the present invention.

In the case of using two coils as in the related art, the magnetic field intensity greatly depends on the gap length between the two coils, and therefore, it is considered that the two coils are provided within the vacuum chamber, in which plasma is generated, for generating a strong magnetic field between the two coils. On the other hand, in the case of using one coil, the magnetic field intensity is determined depending only on the performance of the one coil and not spatially restricted by the EUV collector mirror arrangement or the like. Accordingly, as shown in FIG. 7, the electromagnet 18 and the vacuum chamber 13 can be separated from each other, and assembly, maintenance, and so on can be independently performed.

Further, in the case of using two coils, various units necessary for EUV light source should be provided in the limited space between the two coils. On the other hand, in the case of using one coil, at least the space at one side of the coil can be freely utilized, and the degree of freedom in design and arrangement of the vacuum chamber, target supply unit, laser beam focusing optics, EUV collector mirror, and so on necessary for the EUV light source apparatus becomes high. In addition, there are advantages of using one coil in reduction in initial cost, running cost and so on due to simplification of the apparatus and improvements in reliability due to simple configuration and structure.

As explained above, according to the embodiment, the charged particles such as ions emitted from plasma can be efficiently ejected by the action of one coil. Thereby, the contamination and damage of the EUV collector mirror can be suppressed, and the reduction in use efficiency of EUV light due to the reduction in reflectance of the mirror can be prevented and the life of the EUV collector mirror can be extended. Further, by suppressing the concentration rise of ions and so on, the absorption of EUV light by ions and so on can be suppressed and the use efficiency of EUV light can be improved.

Next, an EUV light source apparatus according to the second embodiment of the present invention will be explained with reference to FIGS. 8 and 9.

Figure 8:
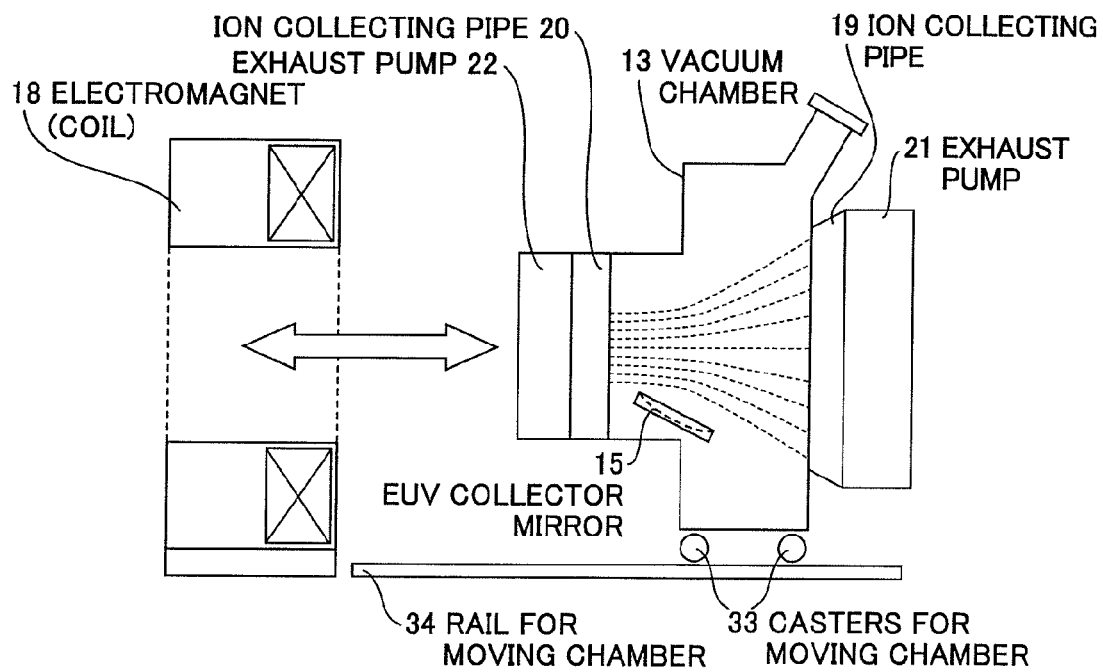
FIG. 8 is a side view showing a configuration of an EUV light source apparatus according to the second embodiment of the present invention.

FIG. 8 is a side view showing a configuration of the EUV light source apparatus according to the second embodiment of the present invention. In the embodiment, the electromagnet 18 (coil) is vertically placed, casters for moving chamber 33 are provided on the vacuum chamber 13, and a rail for moving chamber 34 is laid on the floor facing the casters for moving chamber 33 such that the vacuum chamber 13 can be separated from the electromagnet 18 and moved.

Figure 9:
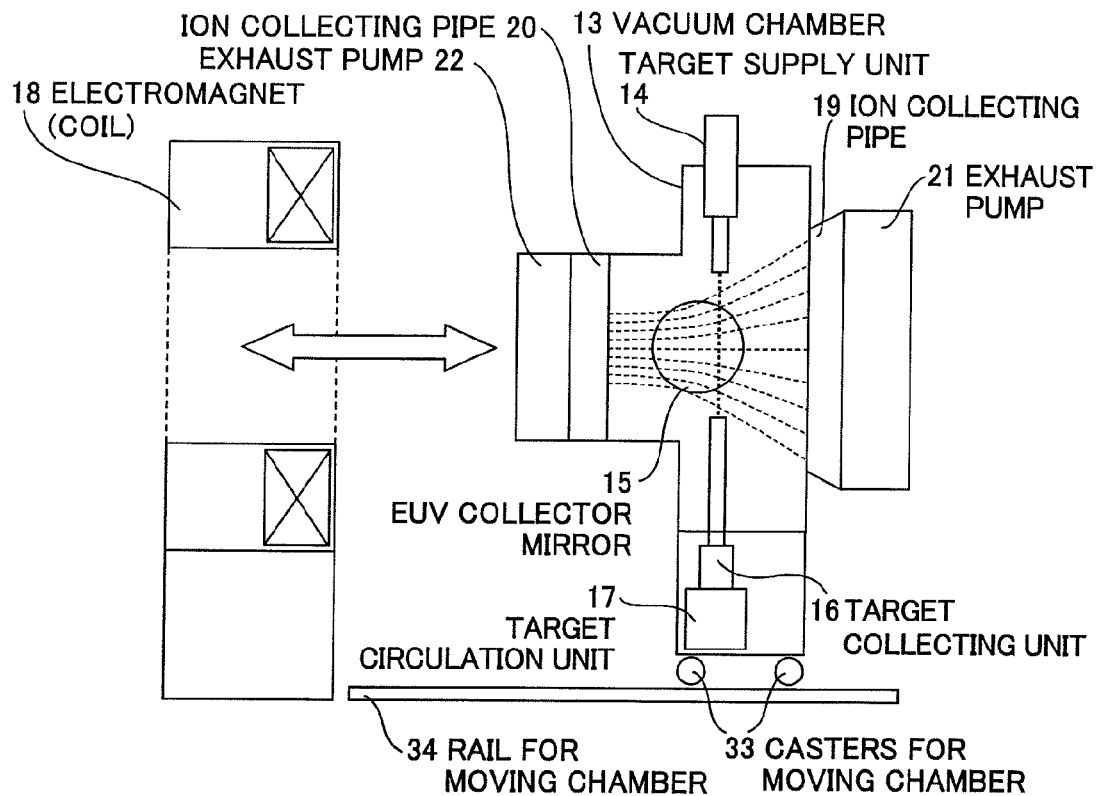
FIG. 9 is a side view showing a modified example of the EUV light source apparatus according to the second embodiment of the present invention.
Figure 10:
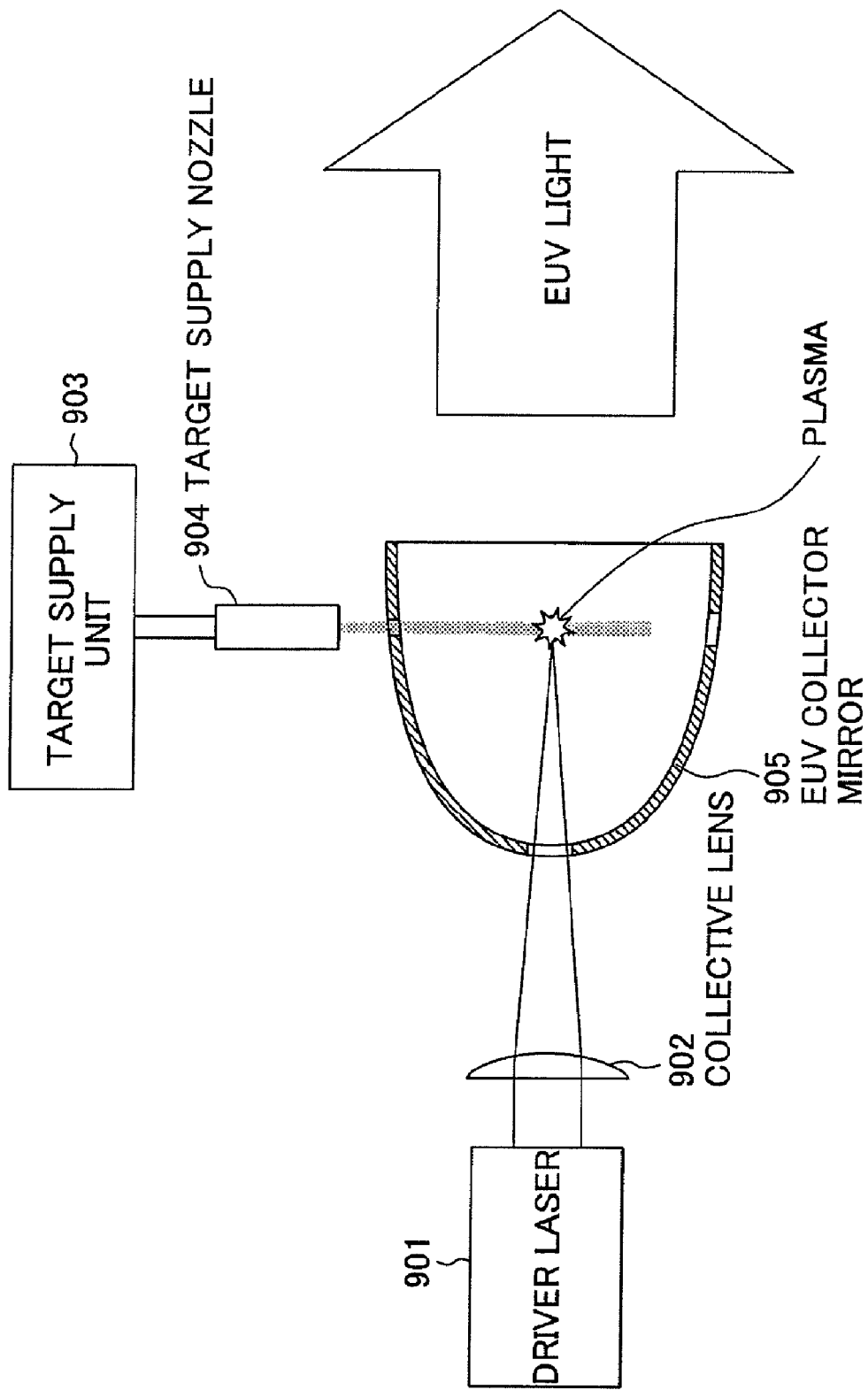
FIG. 10 is a schematic diagram for explanation of a principle of generating EUV light in an LPP type EUV light source apparatus.

Although the EUV collector mirror 15 is provided in the lower part in FIG. 8, the EUV collector mirror 15 may be provided at the front of the drawing as shown in FIG. 9. In this case, the target supply unit 14 is located at the upper side and the target collecting unit 16 is located at the lower side.

As explained above, according to the respective embodiments of the present invention, the charged particles such as ions emitted from plasma can be led out in a desired direction by the influence of the asymmetric magnetic field generated by one coil. Therefore, by promptly removing the charged particles from the vicinity of the EUV collector mirror, the contamination and damage of the EUV collector mirror can be suppressed and its life can be extended. Further, the reduction in reflectance of the EUV collector mirror is also suppressed, and the reduction in EUV light use efficiency can be prevented. Furthermore, by promptly removing the charged particles from the vicinity of the emission point, the absorption of EUV light by ions can be suppressed and the EUV light use efficiency can be improved. As a result, the reduction of cost at operation of the EUV light source apparatus and the reduction of cost at maintenance and replacement of parts can be realized, and further, the utilization rate of exposure equipment using the EUV light source apparatus and productivity of semiconductor devices by the exposure equipment can be improved.

The invention claimed is:

1. An extreme ultra violet light source apparatus of a laser produced plasma type for generating extreme ultra violet light from plasma generated by irradiating a target material with a laser beam, said apparatus comprising:
 a chamber;
 a target supply unit configured to supply a target material into said chamber;
 a collector mirror configured to collect extreme ultra violet light radiated from plasma generated by irradiating the target material with a laser beam to output the extreme ultra violet light;
 an electromagnet arranged outside of said chamber; and
 a charged particle collection mechanism provided on at least one of two surfaces of said chamber to which lines of magnetic force generated by said electromagnet extend.

2. The extreme ultra violet light source apparatus according to claim 1, wherein said chamber and said electromagnet can be separated from each other.

3. The extreme ultra violet light source apparatus according to claim 2, wherein a caster to be used when said chamber is separated from said electromagnet and moved is provided on said chamber, and a rail is provided on a floor facing said caster.

4. The extreme ultra violet light source apparatus according to claim 1, wherein said charged particle collection mechanism includes:
 a collecting pipe configured to collect charged particles emitted from the plasma; and
 an exhaust pump configured to guide the charged particles staying within said chamber to said collecting pipe.

5. The extreme ultra violet light source apparatus according to claim 1, wherein said chamber includes a non-magnetic material.

6. The extreme ultra violet light source apparatus according to claim 1, wherein said electromagnet is arranged such that a center axis of a coil of said electromagnet is substantially parallel with a floor.

7. An extreme ultra violet light source apparatus of a laser produced plasma type for generating extreme ultra violet light from plasma generated by irradiating a target material with a laser beam, said apparatus comprising:
 a chamber;
 a target supply unit configured to supply a target material into said chamber;
 a collector mirror configured to collect extreme ultra violet light radiated from plasma generated by irradiating the target material with a laser beam to output the extreme ultra violet light;
 an electromagnet arranged inside of said chamber; and
 a charged particle collection mechanism provided on at least one of two surfaces of said chamber to which lines of magnetic force generated by said electromagnet extend.

8. The extreme ultra violet light source apparatus according to claim 7, wherein said electromagnet includes:
 a coil winding;
 a cooling mechanism configured to cool said coil winding; and
 a container configured to store said coil winding and said cooling mechanism.

* * * * *